US009444451B2

United States Patent
Sato

(10) Patent No.: US 9,444,451 B2
(45) Date of Patent: Sep. 13, 2016

(54) SWITCH CIRCUIT

(71) Applicant: Seiko Instruments Inc., Chiba (JP)

(72) Inventor: Yutaka Sato, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 35 days.

(21) Appl. No.: 14/469,207

(22) Filed: Aug. 26, 2014

(65) Prior Publication Data

US 2014/0361825 A1     Dec. 11, 2014

Related U.S. Application Data

(63) Continuation of application No. PCT/JP2013/051706, filed on Jan. 28, 2013.

(30) Foreign Application Priority Data

Feb. 29, 2012 (JP) ................................. 2012-044156

(51) Int. Cl.
*H03K 17/687* (2006.01)
*H03K 17/06* (2006.01)

(52) U.S. Cl.
CPC .......... *H03K 17/687* (2013.01); *H03K 17/063* (2013.01); *H03K 17/6872* (2013.01); *H03K 2217/0018* (2013.01); *H03K 2217/0054* (2013.01)

(58) Field of Classification Search
CPC .................................................. H03K 17/063
See application file for complete search history.

(56) References Cited

U.S. PATENT DOCUMENTS

| 4,985,703 | A | 1/1991 | Kaneyama | |
|---|---|---|---|---|
| 6,400,209 | B1 * | 6/2002 | Matsuyama | G05F 1/565 327/427 |
| 6,911,860 | B1 * | 6/2005 | Wang | H03K 3/356113 327/333 |
| 7,031,349 | B1 | 4/2006 | Seifert et al. | |
| 8,810,302 | B2 * | 8/2014 | Bottarel | B06B 1/0215 327/365 |

FOREIGN PATENT DOCUMENTS

| GB | 2319128 A | 5/1998 |
|---|---|---|
| JP | 01-198823 A | 8/1989 |
| JP | 01-236731 | 9/1989 |
| JP | 2002-527975 A | 8/2002 |
| JP | 2010-206779 | 9/2010 |

OTHER PUBLICATIONS

International Search Report of PCT/JP2013/051706 dated Feb. 19, 2013, 2 pages.

* cited by examiner

*Primary Examiner* — Hai L Nguyen
(74) *Attorney, Agent, or Firm* — Brinks Gilson & Lione

(57) ABSTRACT

Provided is a switch circuit capable of reliably controlling the transmission or interruption of a voltage of from GND to VDD to an internal circuit even when a positive or negative voltage is input to an input terminal. By adding PMOS transistors to NMOS transistors constituting the switch circuit and controlling gates of the PMOS transistors by a voltage of the input terminal, the transmission or interruption of the voltage of from GND to VDD can be reliably controlled.

1 Claim, 4 Drawing Sheets

SWITCH CIRCUIT

RELATED APPLICATIONS

This application is a continuation of PCT/JP2013/051706 filed on Jan. 28, 2013, which claims priority to Japanese Application No. 2012-044156 filed on Feb. 29, 2012. The entire contents of these applications are incorporated herein by reference.

BACKGROUND OF THE INVENTION

1. Field of the Invention

The present invention relates to a switch circuit to be provided to a terminal to which a positive or negative voltage is input.

2. Description of the Related Art

FIG. 4 illustrates a conventional switch circuit. The switch circuit controls whether a positive or negative voltage input to an input terminal IN is transmitted or interrupted to an internal circuit 15 in response to a signal of a switch control terminal EN.

First consider the case where a positive voltage VIN+ input from the input terminal IN is transmitted to a node B serving as an input terminal of the internal circuit 15. The signal of the switch control terminal EN is set to a VDD voltage in an active state, to thereby turn ON NMOS transistors 11 and 12. Therefore, the positive voltage VIN+ input from the input terminal IN is transmitted to the node B serving as the input of the internal circuit 15. In this case, an NMOS transistor 13 is turned OFF, and hence the NMOS transistor 13 does not affect the voltage of the node B.

Next consider the case where the positive voltage VIN+ input from the input terminal IN is not transmitted to the node B serving as the input of the internal circuit 15. The signal of the switch control terminal EN is set to a GND voltage in an inactive state. A drain of the NMOS transistor 11 has the voltage VIN+ and a gate thereof has the GND voltage, and hence the NMOS transistor 11 is turned OFF. The NMOS transistor 13 is turned ON so that a node A has the GND voltage. A drain and a gate of the NMOS transistor 12 have the GND voltage, and hence the NMOS transistor 12 is turned OFF. Therefore, the positive voltage VIN+ input from the input terminal IN is not transmitted to the node B serving as the input of the internal circuit 15.

Next consider the case where a negative voltage VIN− input from the input terminal IN is not transmitted to the node B serving as the input of the internal circuit 15. The signal of the switch control terminal EN is set to the GND voltage in the inactive state. However, the drain of the NMOS transistor 11 is applied with the negative voltage VIN− lower than the GND voltage input from the input terminal IN, and hence the NMOS transistor 11 becomes an ON state in the weak inversion region. In this case, the NMOS transistor 13 is turned ON, and hence the node A has the GND voltage rather than the input negative voltage VIN−. The drain and the gate of the NMOS transistor 12 have the GND voltage, and hence the NMOS transistor 12 is turned OFF. Therefore, the negative voltage VIN− input from the input terminal IN is not transmitted to the node B serving as the input of the internal circuit 15.

In this way, even when a negative voltage is input from the input terminal IN, the conventional switch circuit can prevent the negative voltage from being transmitted to the input of the internal circuit 15, thus preventing an erroneous operation of the internal circuit.

In the conventional switch circuit, however, when the active state of the signal of the switch control terminal EN is set to the VDD voltage, the positive voltage VIN+ input from the input terminal IN equal to or higher than a voltage (VDD−VGS−VOV) cannot be transmitted to the node B, where VDD represents a power supply voltage, VGS represents a threshold voltage (VGS>0 V) of the NMOS transistors 11 and 12, and VOV represents an overdrive voltage (VOV>0 V) necessary for reliably turning ON the NMOS transistors 11 and 12.

Further, in order to transmit a voltage equal to or higher than the voltage (VDD−VGS−VOV), for example, the power supply voltage VDD, to the node B, the active state signal of the switch control terminal EN needs to be a voltage equal to or higher than a voltage (VDD+VGS+VOV). Therefore, a booster circuit or a level shift circuit is necessary, which increases the circuit scale and the cost of products.

SUMMARY OF THE INVENTION

In order to solve the above-mentioned problem, according to an exemplary embodiment of the present invention, there is provided a switch circuit including: a first NMOS transistor including a drain connected to an input terminal of a semiconductor device, a source connected to a first node, and a gate connected to a control terminal; a second NMOS transistor including a drain connected to the first node, a source connected to a second node, and a gate connected to the control terminal; a first PMOS transistor including a source connected to the input terminal of the semiconductor device, a drain connected to the first node, and a gate connected to the control terminal via an inverter; a second PMOS transistor including a source connected to the first node, a drain connected to the second node, and a gate connected to the control terminal via the inverter; and a third NMOS transistor including a source connected to a ground voltage, a drain connected to the first node, and a gate connected to the control terminal via the inverter, in which the second node is connected to an internal circuit.

According to the switch circuit of the present invention, even when a negative voltage is input from the input terminal, the negative voltage can be prevented from being transmitted to the input of the internal circuit, and further, a positive voltage up to a VDD voltage can be transmitted to the input of the internal circuit.

DETAILED DESCRIPTION OF THE PREFERRED EMBODIMENTS

Referring to the accompanying drawings, a switch circuit according to embodiments of the present invention is described below. The switch circuit controls whether a positive or negative voltage input to an input terminal IN is transmitted or interrupted to an internal circuit 15 in response to a signal of a switch control terminal EN.

First Embodiment

Figure 1:
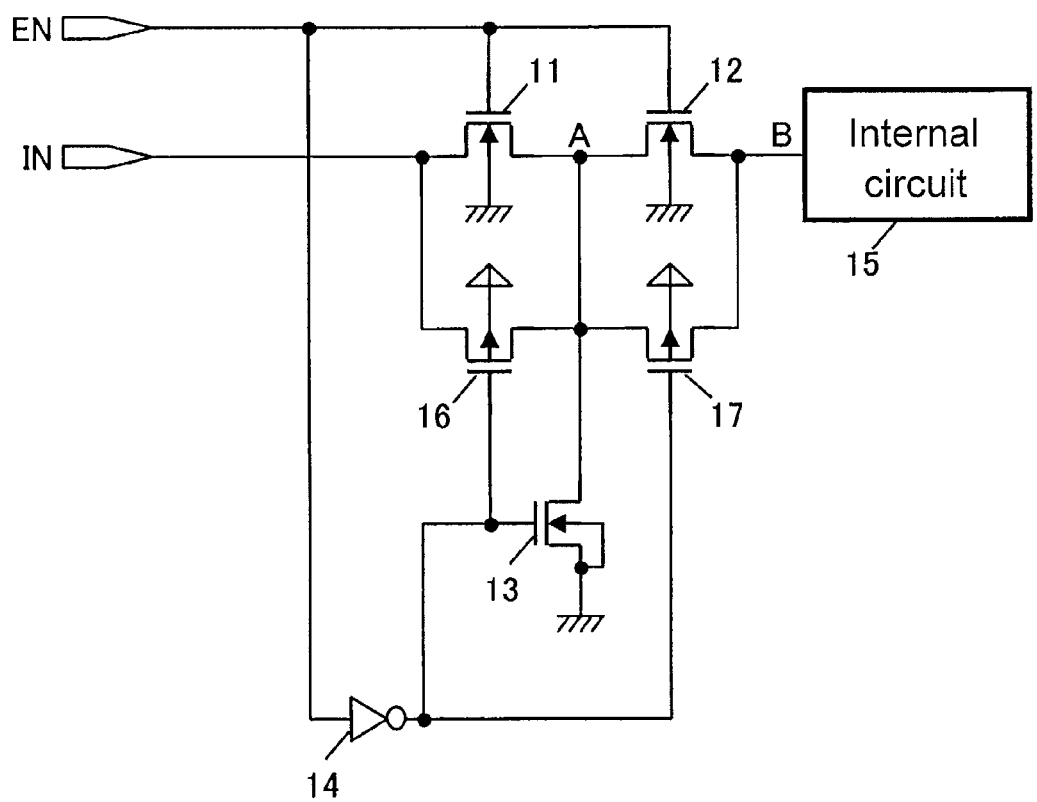
FIG. 1 is a circuit diagram illustrating a switch circuit according to a first embodiment of the present invention.

FIG. 1 is a circuit diagram illustrating a switch circuit according to a first embodiment of the present invention.

The switch circuit in the first embodiment includes NMOS transistors 11, 12, and 13, PMOS transistors 16 and 17, and an inverter 14.

The NMOS transistor 11 has a drain connected to the input terminal IN, a gate connected to the switch control terminal EN, a source connected to a drain of the NMOS transistor 12, and a back gate connected to GND. The NMOS transistor 12 has a gate connected to the switch control terminal EN, a source connected to an input terminal (node B) of the internal circuit 15, and a back gate connected to GND. The PMOS transistor 16 has a source connected to the input terminal IN, a gate connected to an output terminal of the inverter 14, a drain connected to a source of the PMOS transistor 17, and a back gate connected to VDD. The PMOS transistor 17 has a gate connected to the output terminal of the inverter 14, a drain connected to the node B, and a back gate connected to VDD. The inverter 14 has an input terminal connected to the switch control terminal EN. The NMOS transistor 13 has a gate connected to the output terminal of the inverter 14, a source grounded to GND, a drain connected to the source of the NMOS transistor 11, to the drain of the NMOS transistor 12, to the drain of the PMOS transistor 16, and to the source of the PMOS transistor 17, and a back gate connected to GND.

The NMOS transistors 11 and 12 and the PMOS transistors 16 and 17 are controlled to be turned ON/OFF in response to a signal of the switch control terminal EN. The inverter 14 inverts an input signal of a VDD/GND voltage, and outputs the inverted signal. The NMOS transistor 13 is controlled to be turned ON when the NMOS transistors 11 and 12 and the PMOS transistors 16 and 17 are turned OFF.

Next, the operation of the switch circuit in the first embodiment is described.

(1) Case where positive voltage VIN+ input from input terminal IN is not transmitted to node B To the switch control terminal EN, a signal of the GND voltage in an inactive state is input. The drain of the NMOS transistor 11 has the voltage VIN+ and the gate thereof has the GND voltage, and hence the NMOS transistor 11 is turned OFF. The source of the PMOS transistor 16 has the voltage VIN+ and the gate thereof has the VDD voltage, and hence the PMOS transistor 16 is turned OFF. The gate of the NMOS transistor 13 has the VDD voltage, and hence the NMOS transistor 13 is turned ON so that a node A has the GND voltage. The drain and the gate of the NMOS transistor 12 have the GND voltage, and hence the NMOS transistor 12 is turned OFF. The source of the PMOS transistor 17 has the GND voltage and the gate thereof has the VDD voltage, and hence the PMOS transistor 17 is turned OFF. Therefore, the positive voltage VIN+ input from the input terminal IN is not transmitted to the node B.

(2) Case where negative voltage VIN− input from input terminal IN is not transmitted to node B To the switch control terminal EN, the signal of the GND voltage in the inactive state is input. The drain of the NMOS transistor 11 has the negative voltage VIN− and the gate thereof has the GND voltage, and hence the NMOS transistor 11 becomes an ON state in the weak inversion region. However, the gate of the NMOS transistor 13 has the VDD voltage, and hence the NMOS transistor 13 is turned ON so that the node A has the GND voltage. The drain of the NMOS transistor 12 has the GND voltage and the gate thereof also has the GND voltage, and hence the NMOS transistor 12 is turned OFF. The gates of the PMOS transistors 16 and 17 have the VDD voltage, and hence the PMOS transistors 16 and 17 are turned OFF. Therefore, the negative voltage VIN− input from the input terminal IN is not transmitted to the node B.

(3) Case where positive voltage (VDD voltage) input from input terminal IN is transmitted to node B To the switch control terminal EN, a signal of the VDD voltage in an active state is input. The drain and the gate of the NMOS transistor 11 have the VDD voltage, and hence a voltage (VDD−VGS−VOV) is transmitted to the source (node A), where VDD represents a power supply voltage, VGS represents a threshold voltage (VGS>0 V) of the NMOS transistors 11 and 12, and VOV represents an overdrive voltage (VOV>0 V) necessary for reliably turning ON the NMOS transistors 11 and 12.

On the other hand, the source of the PMOS transistor 16 has the VDD voltage and the gate thereof has the GND voltage, and hence the PMOS transistor 16 is turned ON so that the VDD voltage is transmitted to the drain. In this case, the PMOS transistor 16 is fully turned ON, and hence the drain voltage of the PMOS transistor 16 is dominant in the voltage of the node A. Therefore, the voltage of the node A becomes the VDD voltage.

The same holds true for the relation between the NMOS transistor 12 and the PMOS transistor 17, and hence the VDD voltage can be transmitted to the node B.

As described above, the switch circuit in this embodiment can transmit an input voltage in the range of from the GND voltage to the VDD voltage.

Second Embodiment

Figure 2:
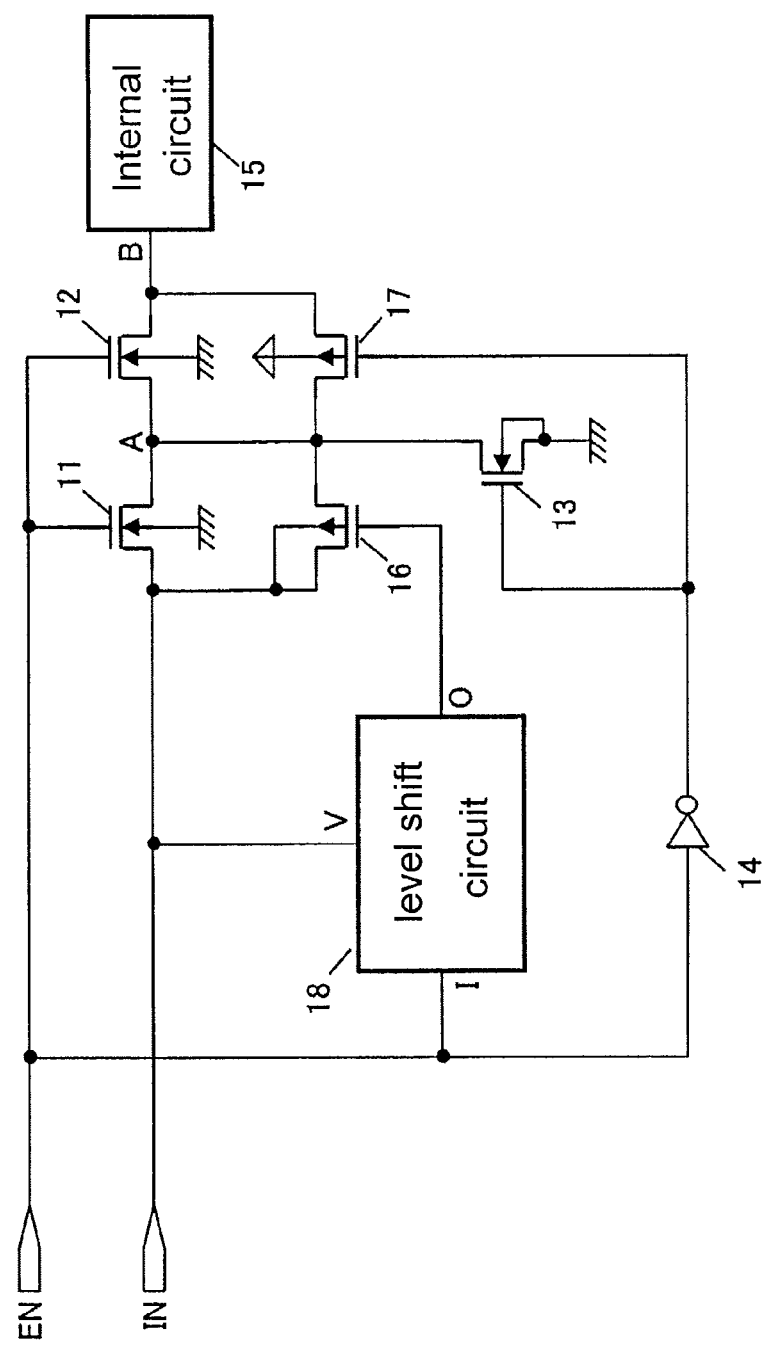
FIG. 2 is a circuit diagram illustrating a switch circuit according to a second embodiment of the present invention.

FIG. 2 is a circuit diagram illustrating a switch circuit according to a second embodiment of the present invention.

The switch circuit in the second embodiment includes a level shift circuit 18 in addition to the circuit of FIG. 1. The level shift circuit 18 has a power supply terminal V connected to the input terminal IN, an output terminal O connected to the gate of the PMOS transistor 16, and an input terminal I connected to the switch control terminal EN. The PMOS transistor 16 has a back gate connected to the input terminal IN.

The level shift circuit 18 performs voltage conversion on a signal of the input terminal I based on a voltage of the power supply terminal V, and outputs the converted signal from the output terminal O. In this embodiment, the level shift circuit 18 is configured to invert the logic between input and output. When a signal of the input terminal I is the VDD voltage, a signal of the GND voltage is output from the output terminal O. When the signal of the input terminal I is the GND voltage, a signal of the voltage of the power supply terminal V is output from the output terminal O.

(1) Case where voltage higher than VDD voltage input from input terminal IN is not transmitted to node B.

If the back gate of the PMOS transistor 16 is connected to VDD, the back gate voltage becomes lower than a source voltage. Therefore, an unnecessary current flows from the input terminal IN to VDD via the PMOS transistor 16 (from source to back gate).

According to the switch circuit in the second embodiment, the back gate and the source of the PMOS transistor 16 are connected to the input terminal IN, and hence there is no potential difference between the back gate and the source, and no current path to VDD exists. The gate of the PMOS transistor 16 has the voltage of the input terminal IN which is output from the output terminal O of the level shift circuit 18. Therefore, the gate of the PMOS transistor 16 is applied with a voltage necessary for turning OFF the PMOS transistor 16.

Other combinations of the voltage of the input terminal IN and the control of the switch circuit have the same circuit operations as those described in the first embodiment.

Figure 3:
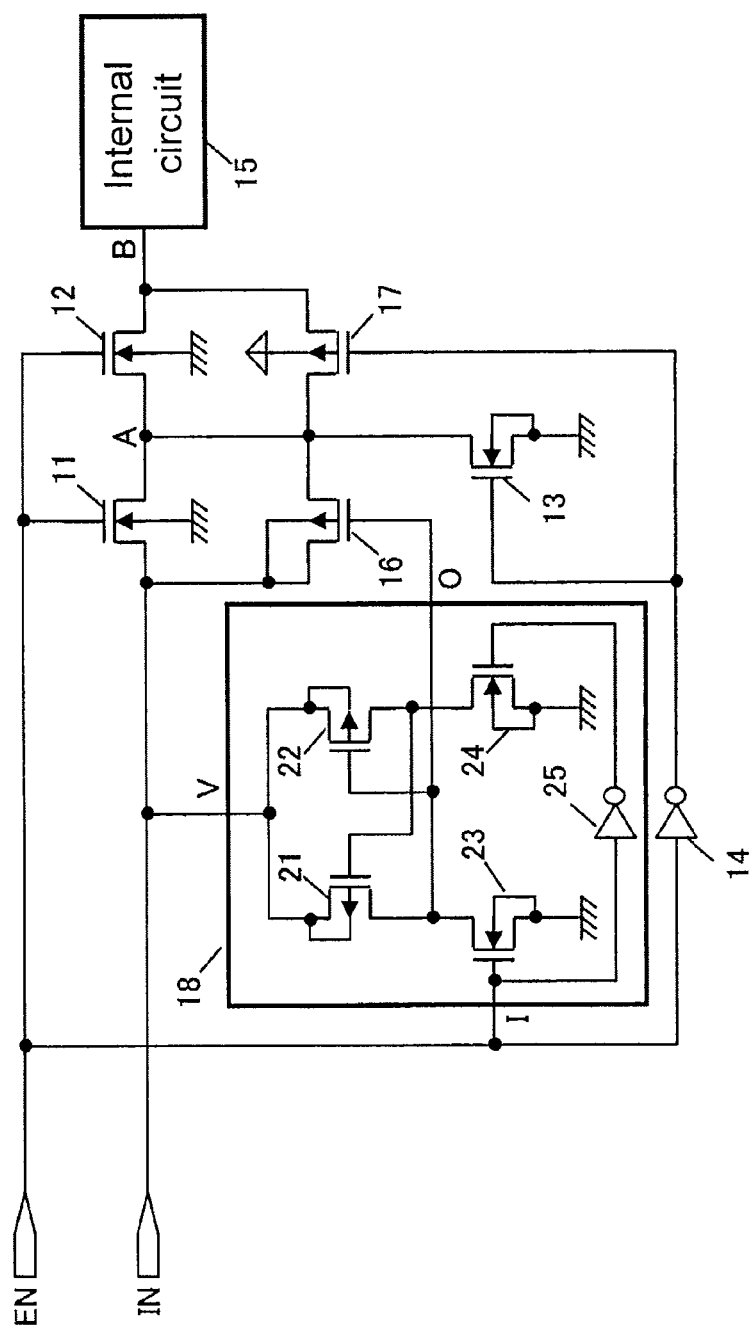
FIG. 3 is a circuit diagram illustrating an example of a level shift circuit according to the second embodiment of the present invention.
Figure 4:
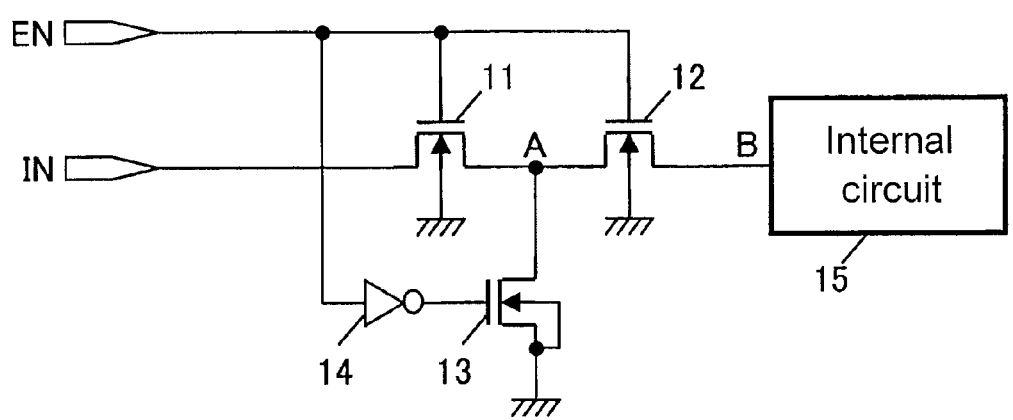
FIG. 4 is a circuit diagram illustrating a conventional switch circuit.

FIG. 3 is an example of the level shift circuit configuration used in the switch circuit of the second embodiment. The level shift circuit only needs to have a simple and general configuration including PMOS transistors 21 and 22 and NMOS transistors 23 and 24.

As described above, according to the switch circuit in the second embodiment, even when a voltage higher than the VDD voltage is applied from the input terminal IN when the switch is OFF, it is possible to prevent an unnecessary current from flowing to the input terminal IN, thus preventing the PMOS transistor 16 from being broken down.

What is claimed is:

1. A switch circuit for routing one of a positive voltage and a negative voltage from and input terminal to an output terminal, the switch circuit comprising:

a first NMOS transistor including a drain connected to the input terminal, a source connected to a first node, and a gate connected to a control terminal;

a second NMOS transistor including a drain connected to the first node, a source connected to a second node, and a gate connected to the control terminal;

a first PMOS transistor including a source connected to the input terminal, a drain connected to the first node;

a second PMOS transistor including a source connected to the first node, a drain connected to the second node, and a gate connected to the control terminal via the inverter;

a third NMOS transistor including a source connected to a ground voltage, a drain connected to the first node, and a gate connected to the control terminal via the inverter; and a level shift circuit that includes an input terminal connected to the control terminal, an output terminal connected to a gate of the first PMOS transistor, and a power supply terminal connected to the input terminal, wherein the first PMOS transistor includes a back gate connected to the input terminal of the switch circuit.

* * * * *